United States Patent [19]
Nishiguchi

[11] Patent Number: 5,403,400
[45] Date of Patent: Apr. 4, 1995

[54] HEAT SINK METHOD OF MANUFACTURING THE SAME AND DEVICE OF MANUFACTURING THE SAME

[75] Inventor: Masanori Nishiguchi, Yokohama, Japan

[73] Assignee: Sumitomo Electric Industries, Ltd., Osaka, Japan

[21] Appl. No.: 228,866

[22] Filed: Apr. 18, 1994

Related U.S. Application Data

[62] Division of Ser. No. 909,707, July 7, 1992, now Pat. No. 5,339,215

[30] Foreign Application Priority Data

Jul. 12, 1991 [JP] Japan .................................. 3-172731

[51] Int. Cl.⁶ ............................................. C23C 16/00
[52] U.S. Cl. .............................. 118/723 EB; 118/730; 118/726
[58] Field of Search ................. 118/723 EB, 726, 728, 118/730

[56] References Cited

U.S. PATENT DOCUMENTS 4,777,908 10/1988 Temple ................................. 118/719
4,951,604 8/1990 Temple ................................. 118/723

Primary Examiner—R. Bruce Breneman
Assistant Examiner—Joni Y. Chang
Attorney, Agent, or Firm—Cushman Darby & Cushman

[57] ABSTRACT

The heat sink is mounted on a semiconductor chip module sealed hermetically with a cap. The heat sink comprises an absorption means for absorbing the heat generated from a semiconductor chip, being inserted into an opening formed in a cap so as to make contact with a semiconductor chip sealed hermetically within a semiconductor chip module; a heat dissipation means exposed outside the cap for dissipating the heat of the semiconductor chip absorbed by the absorption means; and a contact surface disposed between the absorption means and the heat dissipation means and fixed on the upper surface of the cap, and the contact surface at least being coated with an adhesive material. The heat sink mounted on a semiconductor chip module can stably dissipate the heat produced from a semiconductor chip sealed hermetically within the semiconductor chip module.

5 Claims, 4 Drawing Sheets

HEAT SINK METHOD OF MANUFACTURING THE SAME AND DEVICE OF MANUFACTURING THE SAME

This application is a Rule 60 division of Ser. No. 07/909,707 filed Jul. 07, 1992, now Pat. No. 5,339,215.

BACKGROUND OF THE INVENTION

1. Field of the Invention

The present invention relates to a heat sink that can be applied to semiconductor chip modules (multi-chip module and single chip module), and is applicable to fields such as computers, communications and the like where high-speed signal processing is required. The present invention further relates to a method of manufacturing the same, and to its manufacturing device.

2. Related Background Art

With the increasing demands for large-scale functions and high-speed operation electronic devices, logic LSIs have achieved high-speed operation, with a delay time per gate of several hundred picoseconds. However, the conventional assembling structure, which mounts a large number of dual-in packages (DIPs) or plug-in packages on a printed circuit board, produces difficulties in bringing out the potential performance of high-speed LSIs sufficiently. To overcome such a problem, a multi-chip module system has been developed and put into practical use, which mounts a large number of chips on a single ceramic substrate and can provide high-speed performance with high-density assembling (refer to "LSI HANDBOOK", the first edition, pp. 415–416, The Institute of Electronics and Communication Engineers of Japan, 1984).

A prior art structure which dissipates heat to a cooling plate by contacting a piston on a semiconductor chip by means of a spring has been well-known (refer to "Materials/Processing Approaches to Phase Stabilization of Thermally Conductive Pastes" pp. 713–717, IEEE TRANSACTIONS OF COMPONENTS, HYBRIDS, AND MANUFACTURING TECHNOLOGY, Vol. 13, No. 4, December 1990).

However, there are disadvantages in that a semiconductor chip module employing a piston has a large number of components, thus resulting in very high cost.

SUMMARY OF THE INVENTION

In order to solve the above problem, an object of the present invention is to provide a heat sink that can stably dissipate heat generated in a semiconductor chip sealed in a semiconductor chip module, to provide a method of manufacturing the heat sink and to provide a device to manufacture the heat sink.

To solve the above problems, a heat sink mounted on a semiconductor chip module sealed hermetically with a cap, according to the present invention, is characterized by comprising a heat absorption means (for example, one end of a columned member) for absorbing heat generated from a semiconductor chip and being inserted into an opening in the cap to make contact with the semiconductor chip sealed hermetically within the semiconductor chip module; a heat dissipation means (for example, a plurality of discs arranged at the other end of the columned member) for dissipating the heat absorbed by the heat absorption means, being exposed outside the cap; and a contact surface arranged between the heat absorption means and the heat dissipation means and fixed on the upper surface of the cap, the contact surface at least being coated with an adhesive material.

A method of manufacturing the heat sink according to the present invention comprises the steps of: preparing a heat sink on which a contact surface is not coated with an adhesive material, a fixing jig having a groove with a width larger than the outer diameter of a columned member, but smaller than the outer diameter of each of the discs, and a bath containing a liquid adhesive material; engaging the columned member to the groove of the fixing jig and supporting the lower portion of the discs on the upper surface of the fixing jig; and dipping at least the contact surface into the bath.

In this case, the heat sink may be formed of a conductive material and after preparing additionally a first electrode or anode, and a second electrode or cathode, which are connected to a power supply, the second electrode is dipped into a bath containing a plating liquid therein while the first electrode may be partially connected to the heat sink. Then, a voltage may be applied between the heat sink and the second electrode.

Furthermore, a heat sink manufacturing device according to the present invention comprises a fixing jig having a groove with a width larger than the outer diameter of a columned member but smaller than the outer diameter of each of the discs; a vacuum chamber for holding the fixing jig in a vacuum atmosphere; an electron gun mounted rigidly in the vacuum chamber for irradiating an electron beam against an adhesive material contained in a crucible to heat the adhesive material; a first rotary means for rotating the fixing jig in the vacuum chamber; and a second rotary means for revolving the fixing jig with respect to the gun by rotating the first rotary means itself.

When the manufacturing device is used, the above heat sink can be manufactured by the following steps: engaging a columned member to a groove in a fixing jig and supporting the lower portion of discs on the upper surface of the fixing jig; rotating and revolving the fixing jig; and evaporating the adhesive material with heat by irradiating an electron beam against the adhesive material in a vacuum atmosphere, whereby the adhesive material is vapor-deposited at least on the contact surface.

According to the present invention, as the heat sink has a contact surface coated with an adhesive material, it is possible to hermetically seal a semiconductor chip module, with a heat absorption means for the heat sink being inserted into the cap to contact with semiconductor chip.

In addition, according to the heat sink manufacturing method of the present invention, the heat dissipation means of the heat sink can be positioned so that the heat sink is dipped into a bath by supporting the heat sink by a fixing jig.

Furthermore, according to the heat sink manufacturing device of the present invention, as the position of the fixing jig varies relative to the adhesive material placed in the crucible, which is heated and evaporated by the electron beam emitted from an electron gun, the evaporated adhesive material can be deposited almost uniformly on the contact surface.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
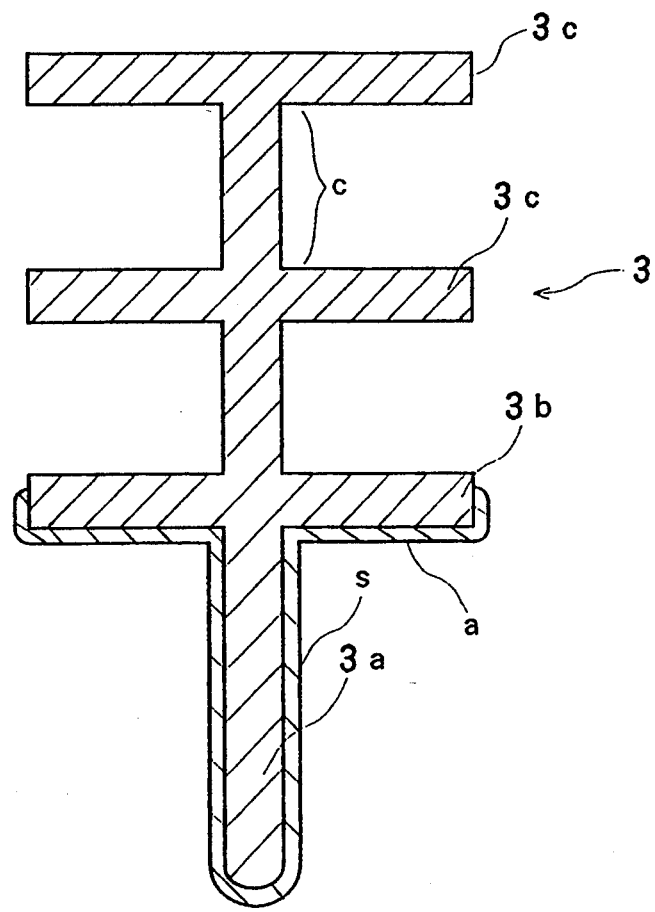
FIG. 1 is a vertical cross-sectional view showing a heat sink according to an embodiment of the present invention.
Figure 2:
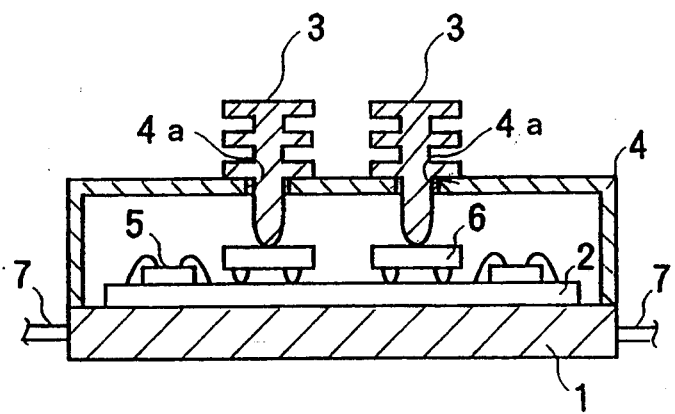
FIG. 2 is a vertical cross-sectional view showing a multi-chip module mounting a heat sink according to an embodiment of the present invention, and taken along the inserting direction of the heat sink.

First, a multi-chip module structure mounting the heat sink according to the present embodiment is explained below in reference with FIG. 1 and FIG. 2. The multi-chip module includes a lower substrate 1, an upper substrate 2, a heat sink 3, and a cap 4. The lower substrate 1 is made of an aluminum oxide material, and has plural lead pins 7 extending from the side surfaces thereof, the lead pins being connected to electric circuits formed with the upper substrate 2. The upper substrate 2 is made of an insulating material of a low dielectric constant. For example, a 3-inch square polyimide multi-layered wiring structure with a thermal resistance of 3° C./W and a thermal via(refer to "Copper Polyimide Multi-layered Wiring Boards", HYBRIDS, Vol. 7, No. 1, pp. 10–12).

The cap 4, for example, is made of 1 mm thick Kover in a shape of a lid. An opening 4a with an inner diameter of 6 to 8 millimeter is formed in the cap 4 at the position corresponding to the mounting position of the semiconductor chip 6, which produces a relatively large amount of heat. One end of the heat sink 3 is inserted into the opening 4a. The heat sink 3 is made of a material of high heat conductivity such as Al, CuW, AlN, CBN, and diamond, etc. and includes an absorption portion 3a, a contact portion 3b, and a heat dissipation portion 3c. The absorption portion 3a has a shape which makes it easy to insert into the abovementioned opening 4a, for example, a rod shape. Since the heat dissipation portion 3c is exposed outside the cap 4, it has a large surface area to get easily cooled by natural cooling, for example, formed in the shape of a disc. Furthermore, a contact portion 3b in disc form is arranged between the absorption portion 3a and the heat dissipation portion 3c, and the bottom portion thereof is the contact surface "a" to be fixed onto the upper surface of the cap 4. An adhesive material "s", which is formed of, for example, a 100 µm thick solder is coated on the contact surface "a" and the heat adsorption portion 3a. Such a structure allows the heat sink to be inserted easily into the opening 4a of the cap 4, whereby it can make reliable contact with the upper surface of the semiconductor chip 6.

The adhesive material "s", which is fixed on the contact surface "a" of the heat sink 3, is melted through a local heating process or a whole heating process after the absorption portion 3a has been inserted into the cap 4. Then, the heat sink 3 is fixed onto the cap 4, with the absorption portion 3a in contact with semiconductor chip 6, while the cap 4 is sealed hermetically.

Therefore, while the hermetic condition is maintained, the heat conducted from in the semiconductor chip 6 can be effectively dissipated outside the cap 4. The area contact between the absorption portion 3a of the heat sink and the semiconductor chip 6 allows the thermal resistance to be decreased, thus improving the efficiency in thermal conductivity.

The outer diameter basically varies in accordance with the heat generating area in a semiconductor chip module. For example, when a 10 mm square IC chip is used and the heat generating area ranges over the entire upper surface thereof, it is desirable to use a heat sink having a diameter of 10 millimeters. However, when the heat generating area is a portion of the upper surface of a semiconductor chip, it suffices to use a heat sink having an area that only covers the portion thereof. When metal is used for the heat sink material, the diameter of the opening of the cap 4 may be formed larger by about 0.05 mm with respect to the outer diameter of the heat sink. In addition, when a ceramic is used, the opening of the cap 4 may have a diameter larger than the outer diameter of the heat sink by about 0.1 mm.

In this case, it is confirmed that the solder thickness at the tip portion of the heat sink 3 does not depend on the initial thickness and that the final thickness is 10 to 20 µm.

However, it is more desirable to determine the actual solder thickness in consideration of its surface tension, design tolerance variation, etc.

Figure 3:
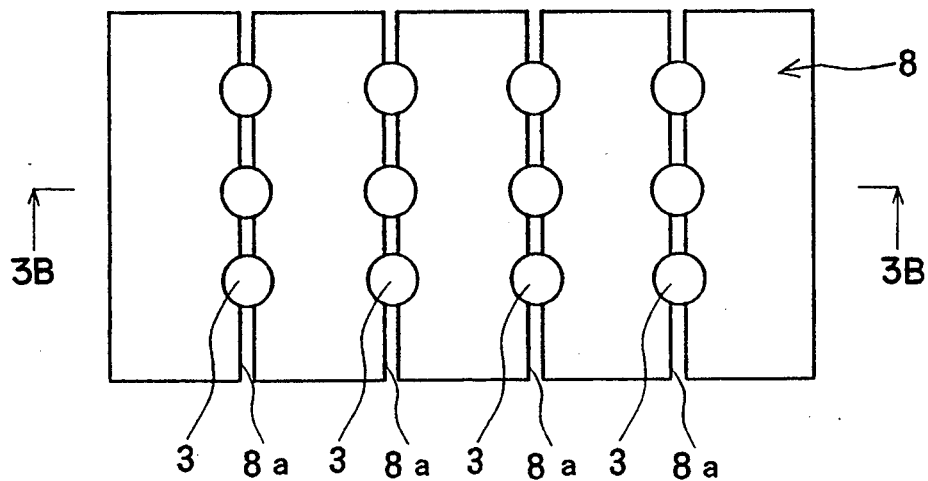
FIG. 3A is a plan view showering a manufacturing device that can be used for the heat sink manufacturing process according to the first embodiment of the present invention.
FIG. 3B is a vertical cross-sectional view of the manufacturing device taken along line 3B—3B of FIG. 3A.
Figure 3:
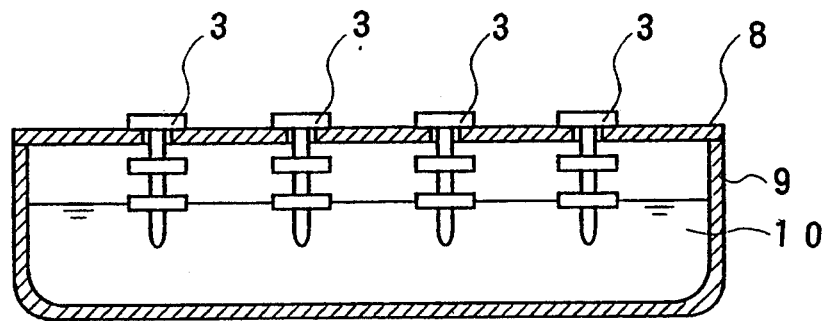

Next, a device for manufacturing a heat sink according to the first embodiment of the present invention is explained below referring to FIGS. 3A and 3B.

This device is equipped with a fixing jig 8 and a dipping container (bath) 9. The dipping container 9 is filled with solder material 10 such as SnPb, which is in a liquid state because the dipping bath is heated above the melting point of the solder material 10. The fixing jig 8 has long and narrow grooves 8a formed in parallel and these grooves 8a supports the heat sink 3 with its contact surface having no adhesive material "s" thereon. Actually, the heat sink 3 is positioned by engaging the columned portion "c" to the groove 8a of the fixing jig, the columned portion "c" being between the uppermost disc and the second disc constituting the heat dissipation portion 3c. The contact surface "a" is dipped into the solder material 10 when the fixing jig 8 is connected with the dipping container 9.

When a fixing jig 8 is mounted on the dipping container 9, all grooves 8a formed in the fixing jig 8 are equally spaced away from the liquid level of a solder material 10 filled in the dipping container 9, so that the grooves 8a are arranged in parallel to the liquid surface. Therefore, if the heat sinks 3 of the same size are used, the contact surfaces a of the heat sinks are contained in the same surface, thus being dipped in the solder material 10 to the same depth (refer to FIG. 3B).

Using the device, the heat sink, according to the present embodiment, can be manufactured by the steps of engaging the columned portion "c" to the groove 8a of the fixing jig; supporting the bottom surface of the heat dissipation portion 3c at the uppermost portion with the upper surface of the fixing jig 8; dipping both the contact surface "a" and the absorption portion 3a into the dipping container 9; and lifting the heat sink 3 to cool it.

Figure 4:
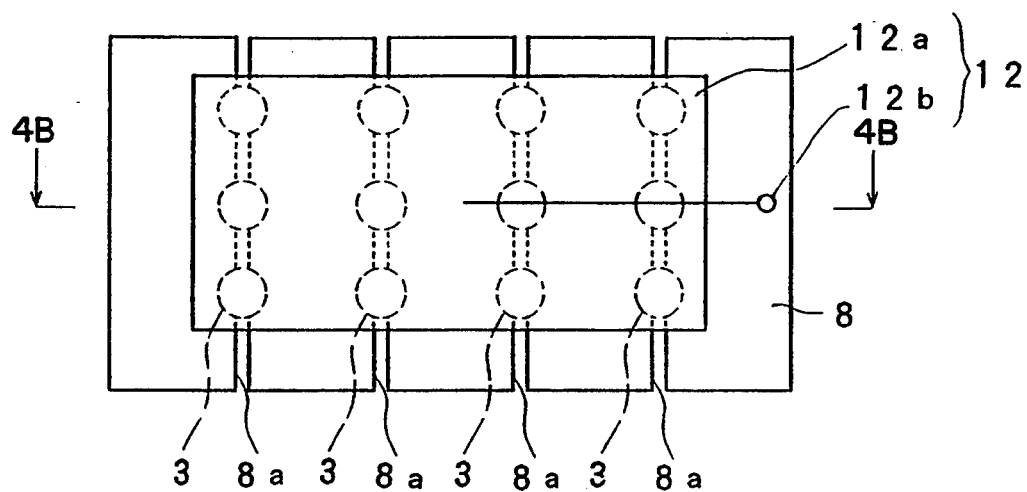
FIG. 4A is a plan view showing the manufacturing device that can be used for a heat sink manufacturing process according to the second embodiment of the present invention.
FIG. 4B is a vertical cross-sectional view of the manufacturing device taken along line 4B—4B shown in FIG. 4A.
Figure 4:
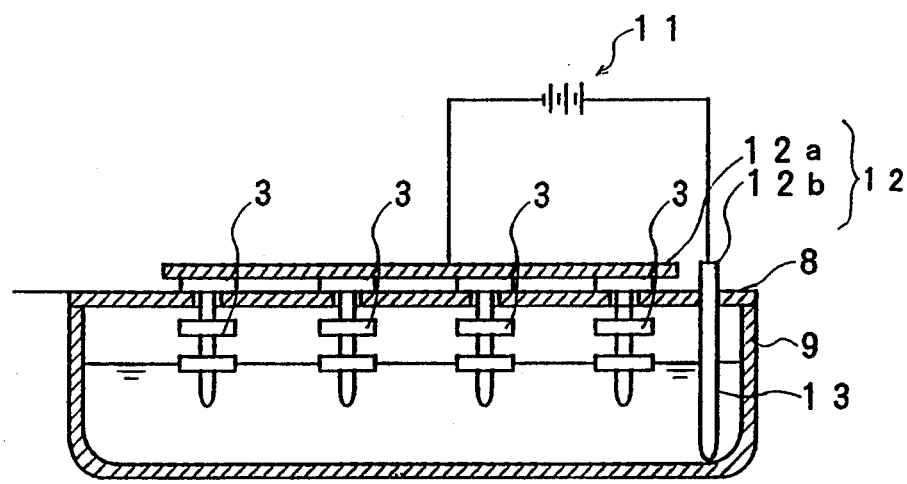

Next, referring FIGS. 4A and 4B, a device to manufacture a heat sink according to the second embodiment of the present invention is now explained. According to the present embodiment, the heat sink 3 being used as part of an electrode is made of a conductive material.

The manufacturing device includes a fixing jig 8, a dipping container 9, an anode (second electrode) 12b and a cathode (first electrode) 12a, each being connected to the same power supply 11. The dipping container 9 is filled with plating solution 13. The anode 12b is made, for example, of an Sn of high purity and is dipped into the plating solution 13. The cathode 12a is collectively connected to the dissipation portion 3c of the heat sinks 3 supported by fixing jig 8. Acid or alkaline solution can be used for the plating solution 13. Because the fixing jig 8 and the dipping container 9 have the above described basic structure, a detailed explanation of them is omitted.

An Sn film can be formed on the contact surface "a" and on the surface of the heat dissipation portion 3c using the device through the process comprising the steps of engaging the columned portion "c" to the groove 8a of the fixing jig and supporting the bottom surface of the heat dissipation portion 3c at the uppermost portion with the upper surface of the fixing jig; dipping at least the contact surface "a" of the heat sink 3 into the dipping container 9; and dipping the anode 12b in the dipping container 9, while the cathode 12a makes partial contact with the heat dissipation portion 3c; and applying a voltage between the heat sink 3 and the anode 12b. As described above, the manufacturing method can simultaneously form a large number of heat sinks, thus increasing productivity. In this case, in order to facilitate adhesion among the heat sink 3, the cap 4, and the semiconductor chip 6, it is desirable that Au is metalized on the contact surface "a" coated fixed with Sn, the upper surface of the semiconductor chip 6 in contact with the heat dissipation portion 3c, the upper surface of the cap 4.

Figure 5:
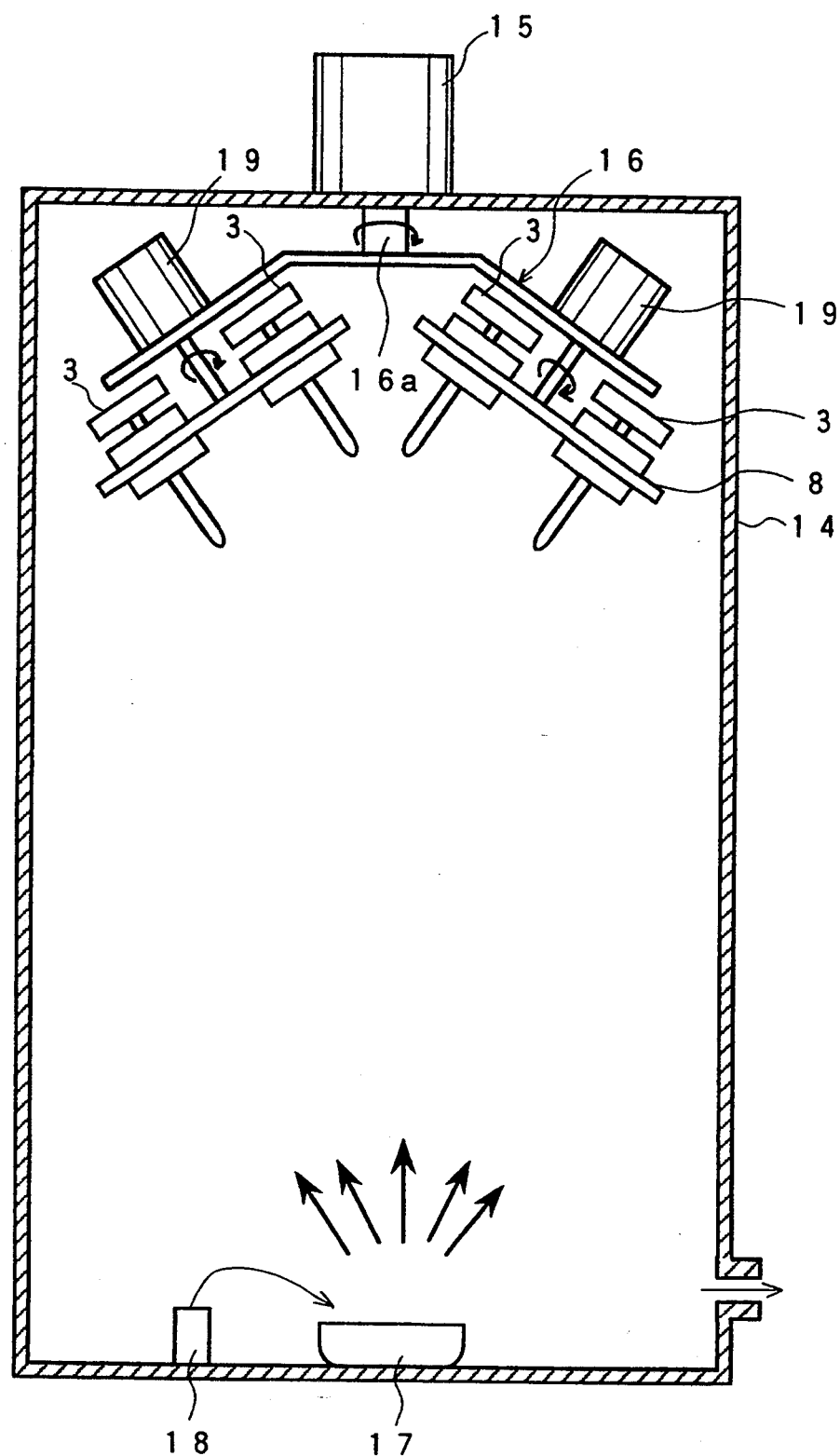
FIG. 5 is a vertical cross-sectional view showing a manufacturing device that can be used for the heat sink manufacturing process according to the third embodiment of the present invention.

Next, referring to FIG. 5, a device of manufacturing a heat sink according to the third embodiment of the present invention is now explained.

The device comprises a vacuum chamber 14 for maintaining a vacuum condition of the inner atmosphere; a rotary member (second rotary means) 16 supported rotatably by a drive of the motor 15 in the vacuum chamber 14; a fixing jig 8 supported rotatably at a position apart from the rotating shaft 16a of the rotary member 16; an electron gun 18 fixed on the bottom portion of the vacuum chamber 14 capable of irradiating an electron beam against Sn material(adhesive material) contained in the crucible 17; and a motor (first rotating means) for rotatably driving the fixing jig 8.

The fixing jig 8 is formed, for example, in the shape of a disc made of SUS material, and has a groove (not shown) having a smaller width than the outer diameter of a disc forming the heat dissipation portion 3c of a heat sink 3, but larger than the outer diameter of the columned portion "c". Here, the motors 15 and 19, which are used to rotate and revolve the fixing jig 8 rotate at about 10 rpm. In the heat sink engaged with the groove, as a portion other than the contact surface "a" is fixed to the fixing jig 8, the heat sink 3 does not drop accidentally from the fixing jig 8 during revolution and rotation of the fixing jig 8. The heat sink 3 is supported stably even during rotation of the fixing jig 8 by engaging the heat dissipation portion 3c of the heat sink 3 to the groove. With the rotation of the rotary member 15 and the fixing jig 8, the heat sink 3 rotates and revolves with respect to an adhesive material to be evaporated by the electron beam from the electron gun 16. As a result, the evaporated Sn gas is deposited uniformly on the contact surface "a" of the heat sink, whereby a vacuum deposition of a nearly uniform Sn layer can be performed. A circular water-cooled copper crucible with an outer diameter of 1 to 3 centimeters may be used as the crucible 17. A SUS-made vacuum chamber of a height of several tens centimeters may be used as the vacuum chamber 14. Generally, vapor-deposition in vacuum is performed at a vacuum degree of $10^{-4}$ mmHg or less and for several to several tens minutes. However, the vapor-deposition time depends on the film thickness.

The Sn film is formed on the contact surface "a" and the surface of the heat dissipation portion 3c using the heat sink manufacturing device through the steps of engaging the columned portion "c" to the groove of the fixing jig 8 and supporting the bottom of the disc forming a part of the heat dissipation portion 3c with the upper surface of the fixing jig 8; rotating and revolving the fixing jig 8 by rotating the motors 15, 18; evaporating Sn by irradiating an electron beam against the Sn in a vacuum atmosphere and by heating the Sn material; and forming at least a deposition film of Sn on the contact surface "a" of the heat sink.

With the rotation of the fixing jig employing the manufacturing device, an adhesive material "s" is coated even on the side surface of the contact portion 3b of the heat sink. However, the adhesive material "s" may be coated only on the contact surface "a" by vapor-depositing along the elongated direction of the absorption portion 3a of the heat sink. The present embodiment realizes the rotation and the revolution of the heat sink 3 by using two kinds of motor. However, a planetary mechanism, for example, may be used for it. It should be noted that the present invention is not restricted to the above-mentioned embodiment. In the present embodiment, basically, the cross-section of the heat sink is columned, with a heat dissipation portion in the shape of a disc and an absorption portion in the shape of cylinder, but these cross-sections should not be limited to such a circular form.

The heat sink according to the present invention can be applied to multi-chip modules and single-chip modules, and can perform effective thermal dissipation.

Furthermore, a heat sink with excellent thermal dissipation characteristics can be simply manufactured by employing the heat sink manufacturing method and device according to the present invention.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A device for manufacturing a heat sink that dissipates externally heat generated from a semiconductor chip sealed hermetically with a cap, the heat sink including an absorption portion inserted into an opening formed in the cap for absorbing the heat generated from the semiconductor chip; a heat dissipation portion exposed to the outside of the cap for dissipating the heat absorbed by the absorption portion from the semiconductor chip; and a contact surface arranged between the absorption portion and the heat dissipation portion and fixed on the upper surface of the cap, the contact surface being coated with an adhesive material, the absorption portion being formed of one end of a columned member the heat dissipation portion being formed by sequentially arranging a plurality of discs on the other end of the columned member at arbitrary intervals, each of the plurality of discs having an outer diameter larger than that of the columned member, the device comprising:

a fixing jig having a groove with a smaller width than the outer diameter of each of said discs and larger than the outer diameter of said columned member;

a vacuum chamber for holding said fixing jig in a vacuum atmosphere;

an electron gun fixed in said vacuum chamber for heating said adhesive material by irradiating an electron beam against said adhesive material contained in a crucible;

a first rotary means for rotating said fixing jig within said vacuum chamber; and a second rotary means for revolving said fixing jig with respect to said electron gun by rotating said first rotary means.

2. A device according to claim 1, wherein said rotary means comprises a motor.

3. A device according to claim 2, wherein said heat sink is arranged symmetrically with respect to the rotating shaft of said first motor.

4. A device according to claim 2, wherein said first motor is arranged symmetrically with respect to the rotating shaft of said second motor.

5. A device according to claim 2, wherein the extension lines of the rotating shafts of said first motor and said second motor intersect at a point.

* * * * *